United States Patent [19]

Hayes et al.

[11] Patent Number: 4,725,748
[45] Date of Patent: Feb. 16, 1988

[54] HIGH SPEED DATA ACQUISITION UTILIZING MULTIPLE CHARGE TRANSFER DELAY LINES

[75] Inventors: Raymond Hayes; Joseph R. Peter, both of Beaverton, Oreg.

[73] Assignee: Tektronix, Inc., Beaverton, Oreg.

[21] Appl. No.: 909,139

[22] Filed: Sep. 19, 1986

Related U.S. Application Data

[62] Division of Ser. No. 730,921, May 6, 1985, Pat. No. 4,648,072.

[51] Int. Cl.[4] .................... H03K 5/159; G11C 11/34
[52] U.S. Cl. ................................. 307/607; 307/480; 365/183; 365/219
[58] Field of Search ............... 377/57, 60, 63; 307/607; 357/24; 365/480, 183, 219

[56] References Cited

U.S. PATENT DOCUMENTS

| | | | |
|---|---|---|---|
| 3,819,953 | 6/1974 | Puckette et al. | 307/607 X |
| 3,913,077 | 10/1975 | Erb | 357/24 X |
| 3,914,748 | 10/1975 | Barton et al. | 357/24 X |
| 3,947,698 | 3/1976 | Cheek, Jr. et al. | 377/57 |
| 3,967,254 | 6/1976 | Kosonocky et al. | 377/63 X |
| 4,093,872 | 6/1978 | Hartman et al. | 377/60 X |
| 4,280,066 | 7/1981 | Engeler et al. | 377/60 X |

Primary Examiner—John S. Heyman
Attorney, Agent, or Firm—John P. Dellett

[57] ABSTRACT

A charge coupled device (CCD) analog shift register in a two-channel serial-parallel-serial (SPS) structure operating in a fast-in/slow-out (FISO) mode for high speed signal acquisition and temporary storage of a plurality of samples. The two CCD arrays are clocked simultaneously, and the input analog signal is demultiplexed to the two arrays. Additional transfer electrodes are provided at the input of one of the arrays, and the other array is provided with a sampling clock which is 180° out of phase with the sampling clock of the first array; two consecutive samples of the input signal are taken during each transfer clock cycle. All signal samples are clocked through the arrays simultaneously and appear at the output at the same time.

6 Claims, 5 Drawing Figures

HIGH SPEED DATA ACQUISITION UTILIZING MULTIPLE CHARGE TRANSFER DELAY LINES

BACKGROUND OF THE INVENTION

This invention relates to transient data recording, and more particularly, to a storage device for temporarily storing high speed samples of an analog input signal.

The development of the silicon planar process has produced a virtual revolution of performance and cost in the field of digital and analog signal processing. One important step of this advance was the development of charge-transfer structures providing storage for a large number of samples of an input signal. In addition to storage, charge-transfer devices provide another advantage in signal processing systems because they need not operate in real time, i.e., increments of phase are determined by an externally applied train of clock signals rather than by a physical phenomenon associated with the device. Therefore, it is possible to perform signal processing with these devices using a task-shared computer. Serial charge-transfer structures are limited in length by imperfect charge-transfer efficiency which causes a cumulative misplacement of the charges representing the input signal. Furthermore, transfer-gate capacitance increases in long serial registers operated at high frequencies. These problems have been alleviated by using a serial-parallel-serial (SPS) organization, and by multiplexing charge-transfer arrays; however, peripheral circuitry such as input circuits, output amplifiers, and particularly circuits for the generation and distribution of clock signals, limit the maximum clock frequency of the device.

Accordingly it is an object of the present invention to provide an improved signal acquisition circuit.

It is another object of the present invention to provide an improved signal acquisition circuit utilizing multiplexed data storage for increasing the rate at which an analog input signal is sampled.

Another object of the instant invention is to provide an improved multiplexed analog delay line storage element in a signal acquisition circuit utilizing a common clock signal for signal propagation in multiplexed delay lines.

Another object of the present invention is to provide an improved analog signal acquisition system utilizing multiplexed charge-coupled device delay lines having common clock drivers.

The present invention, in accordance with one aspect thereof, provides two charge transfer delay line devices on a common substrate having common clock signal drive lines, and each receiving a common analog input signal. One of the devices is provided with an additional set of transfer electrodes at the input circuit which facilitates multiplexed sampling of the input signal using a single driver circuit with output signals operating at one-half the multiplexed sample rate. Subsequent to input sampling, all transfers of the input signal within the two delay line elements are simultaneous, a single set of drive circuits performing charge transfer, output resetting and output sampling.

DRAWINGS

While the invention is set forth with particularity in the appended claims, other objects and features of the instant invention will best be understood by referring to the following detailed description in conjunction with the accompanying drawing in which:

FIG. 1 is a block diagram of a data acquisition system in which the present invention may be utilized, FIG. 2 and alternate configuration FIG. 2A are schematic diagrams of a delay line storage element in accordance with the instant invention, and FIGS. 3 and 4 are timing diagrams useful in explaining the operation of the present invention.

DESCRIPTION OF THE PREFERRED EMBODIMENT

Advances in the integrated circuit and microcomputer arts have changed the face of measurement instruments such as oscilloscopes, spectrum analyzers and the like. Signal acquisition and processing circuits acquire and digitize analog information, store the digital data for subsequent access at selectable rates faster or slower than the inherent rate of the input signal to enhance or capture a particular characteristic of the acquired signal, and reconvert the processed digital data to an analog signal for display.

Figure 1:
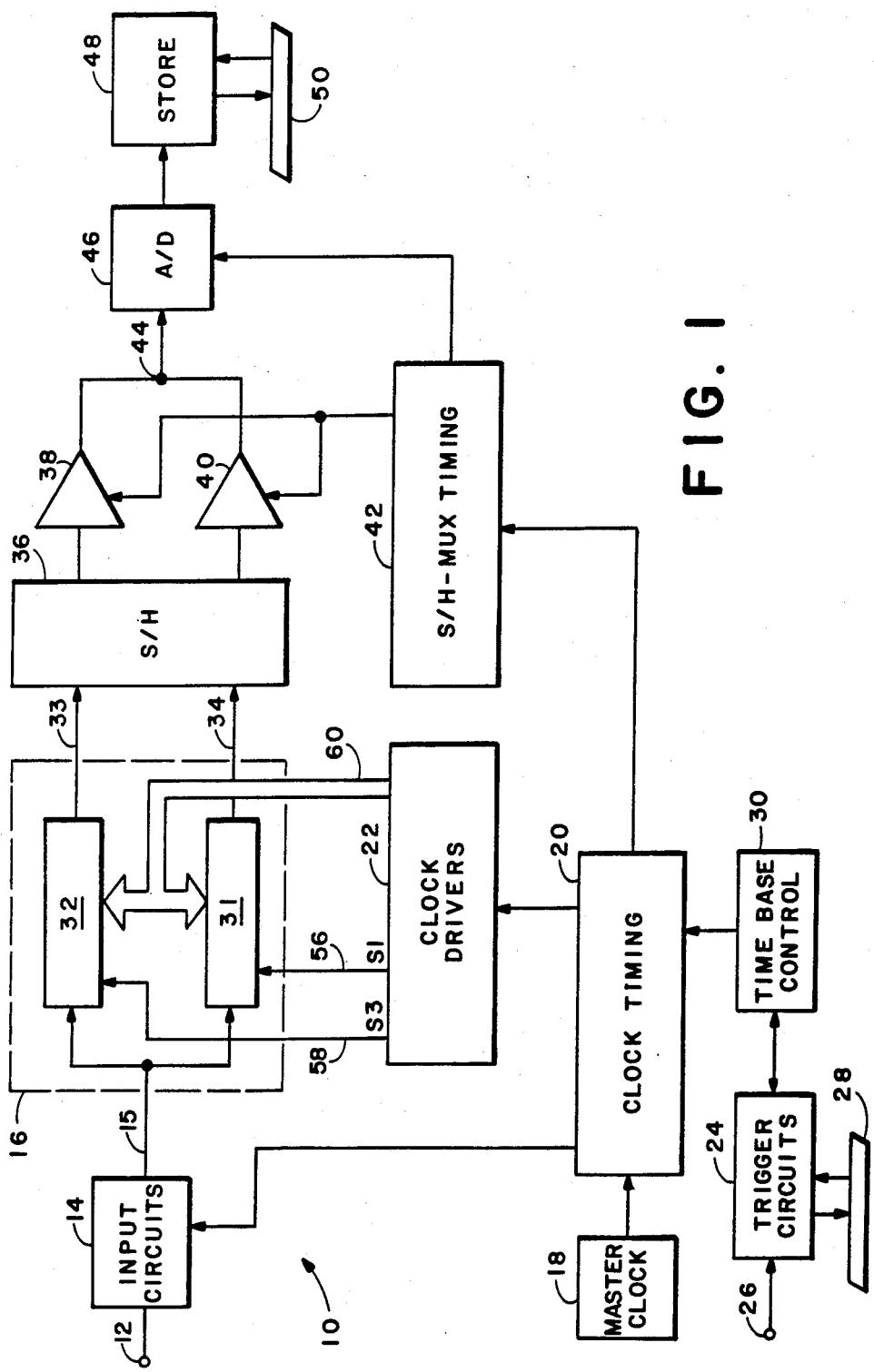

Referring to FIG. 1 by characters of reference, a signal acquisition circuit 10 receives an analog input signal via an input terminal 12 of input circuits 14 which may include, for example, preamplifiers, filters and the like. The input signal is then coupled by way of a connection 15 to an analog-signal delay line 16 for temporary storage. A master clock 18 and clock timing circuits 20 generate timing signals and clock pulses in a manner known in the art for controlling the input circuits 14 as well as clock driver circuits 22 of the delay line 16. Trigger circuits 24 which may receive a trigger signal from an external source 26 or from an internal instrument microprocessor (not shown) via a signal bus 28 are coupled to a time base control circuit 30, while circuit 30 is coupled to the clock timing circuits 20 for controlling input signal acquisition and storage operations.

In conventional oscilloscopes, a trigger signal has heretofore initiated the display of an input signal by initiating a display sweep signal; however, digital processing techniques now allow the display of a significant portion of the input data acquired before generation of the trigger signal. The trigger signal is often utilized to stop acquisition of input data and begin output processing of the data acquired. The initiation of the sweep signal thus loses some of its traditional significance, but the trigger signal acquires additional significance as a point around which pre and post-trigger data items are positioned.

The input signal on connection 15 is demultiplexed to two storage elements 31, 32 of the analog delay line 16, and output simultaneously by way of connections 33, 34 to a sample-and-hold (S/H) circuit 36 and combining amplifiers 38, 40. Timing signals derived from the clock timing circuits 20 by a S/H-MUX timing element 42 enable the S/H circuit 36 as well as the combining amplifiers 38, 40 to apply the recombined input signal through a common connection 44 to a successive-approximation analog-to-digital (A/D) converter 46. Digital data from the A/D converter 46 are stored in an acquisition store 48 from which they may be fetched for additional signal processing and/or display under control of the internal microprocessor via a bus 50.

The analog delay line 16 comprises an NMOS integrated circuit having two charge-coupled devices (CCDs) 31, 32 that function as analog shift registers providing high speed sampling and short-term analog storage of up to 1024 samples of the input signal. The analog sampling bandwidth of the delay line 16 is in the range of 500–600 megahertz; the input sampling rate, up to 500 megasamples per second. The input signal on the connection 15 is applied to both CCDs 31, 32 and is demultiplexed to the delay lines under control of sampling signals S1 and S3 applied respectively, via connections 56, 58. Clock signals on a bus 60 from the clock drivers 22 are common to both CCDs 31, 32.

Figure 2:
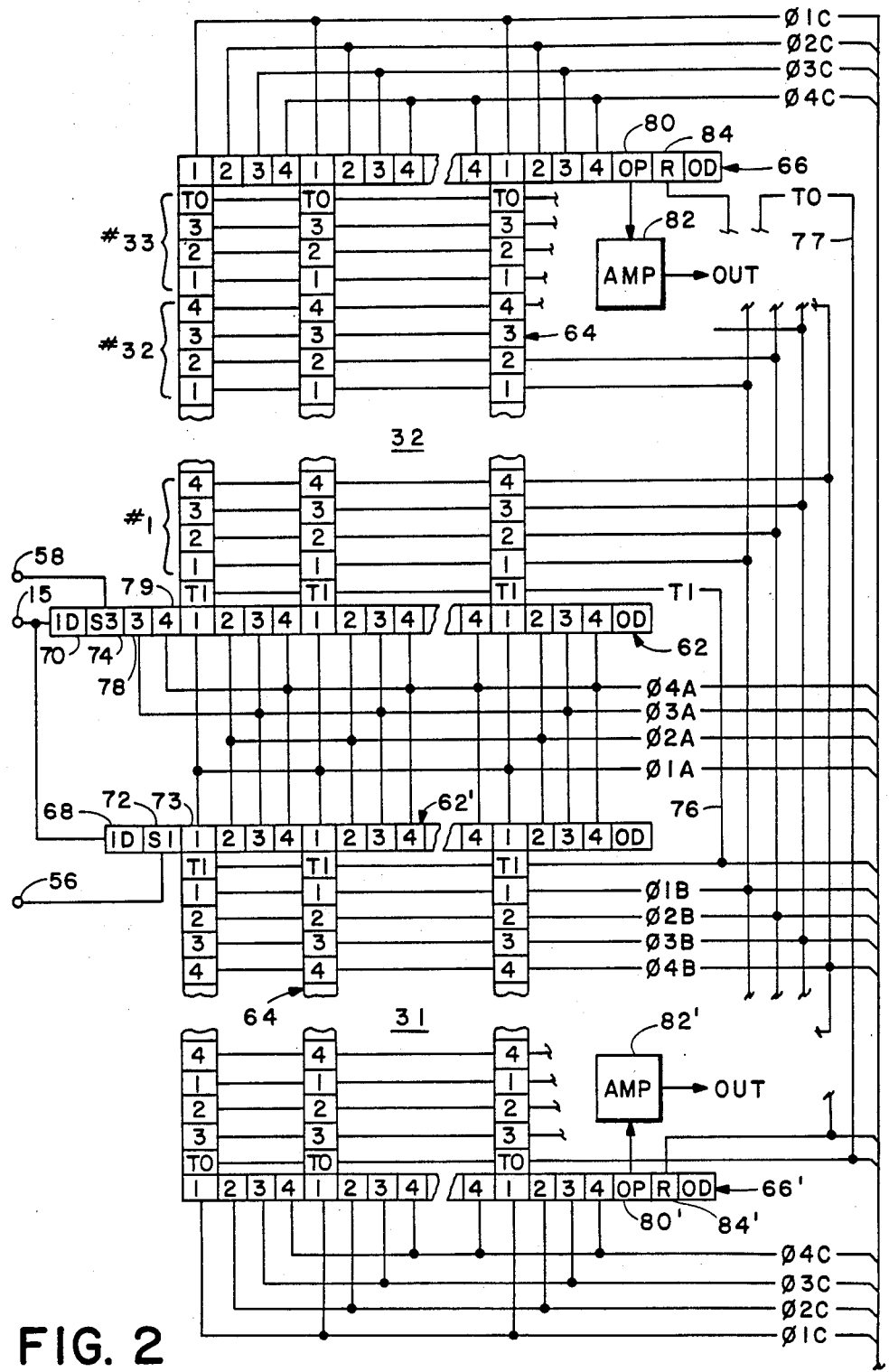

Referring now to FIG. 2, the delay line 16 of FIG. 1 is shown in greater detail. Each of the CCDs 31, 32 is a serial-parallel-serial (SPS) structure. Although one of the CCD structures 32 is frequently described in the ensuing discussion, the description applies generally to both structures 31, 32, and characters of reference denoting similar elements in the CCD 31 are denoted in FIG. 2 by like reference characters with primed symbols. The CCD delay line element 32 comprises a serial input register 62 having sixteen charge-transfer cells, each cell having four charge transfer electrodes 1, 2, 3, 4, and each of the numbered electrodes corresponding with one phase of a four-phase clock signal which propagates charge packets through the CCD in a manner well known in the art. Sixteen parallel registers 64 each having 33 charge transfer cells connect the serial input register 62 with a serial output register 66 to form an input control circuit of each of the charge-transfer devices 31, 32, which input control circuits include the well known SPS CCD structure. The input signal on connection 15 is coupled in common to input diodes 68, 70 of the respective serial input registers 62', 62. The sampling signal S1 on the connection 56 is applied to a element or electrode 72 of the channel 1 CCD 31 while the sampling signal S3 on the terminal 58 is connected to a element or electrode 74 of the channel 2 CCD 32. A common timing signal T1 coupled to transfer electrode T1 of each of the parallel registers 64, 64' via a connection 76 transfers data from the serial input registers 62, 62' respectively, to the parallel registers 64, 64'. A common timing signal T0, coupled by way of a connection 77 to transfer electrodes T0 of the parallel registers 64, 64', transfers data from the parallel registers 64, 64' respectively, to the serial output registers 66, 66'. The serial input register 62 of the channel 2 CCD 32 is provided with two additional transfer electrodes 78, 79 between the input circuit, comprising the input diode 70 and the sample electrode 74 and the first four-electrode charge transfer cell while no such additional transfer electrodes are provided in the channel 1 CCD 31. The additional charge-transfer electrodes 78, 79 are termed a partial charge-transfer cell. Clock signals ∅1A–∅4A are connected, respectively, to the transfer electrodes 1 ∝ 4 of both serial input registers 62, 62'. Transfer clock signals ∅1B–∅4B are connected, respectively, to the transfer electrodes 1-4 of the parallel registers 64, 64' of both CCDs. Furthermore, clock signals ∅1B–∅4B are connected, respectively, to the transfer electrodes 1-4 of the serial output registers 66, 66' of both CCDs 31, 32, and a reset clock R is applied to a reset gate 84, 84' in the output circuit of both the serial output registers 66, 66'.

The analog delay line of FIG. 2 thus includes two storage arrays 31, 32 which form two channels in a SPS structure, each array having a sixteen-stage input register, a 16×33 stage storage array and a sixteen stage output register. The structure operates in a fast-in/slow-out (FISO) mode for high-speed signal acquisition. In an alternate embodiment of the FIG. 2 structure, four storage arrays which form two channels having differential input and output signals are implemented on a single substrate. Common clock-signal drives are utilized to drive both channels.

Figure 3:
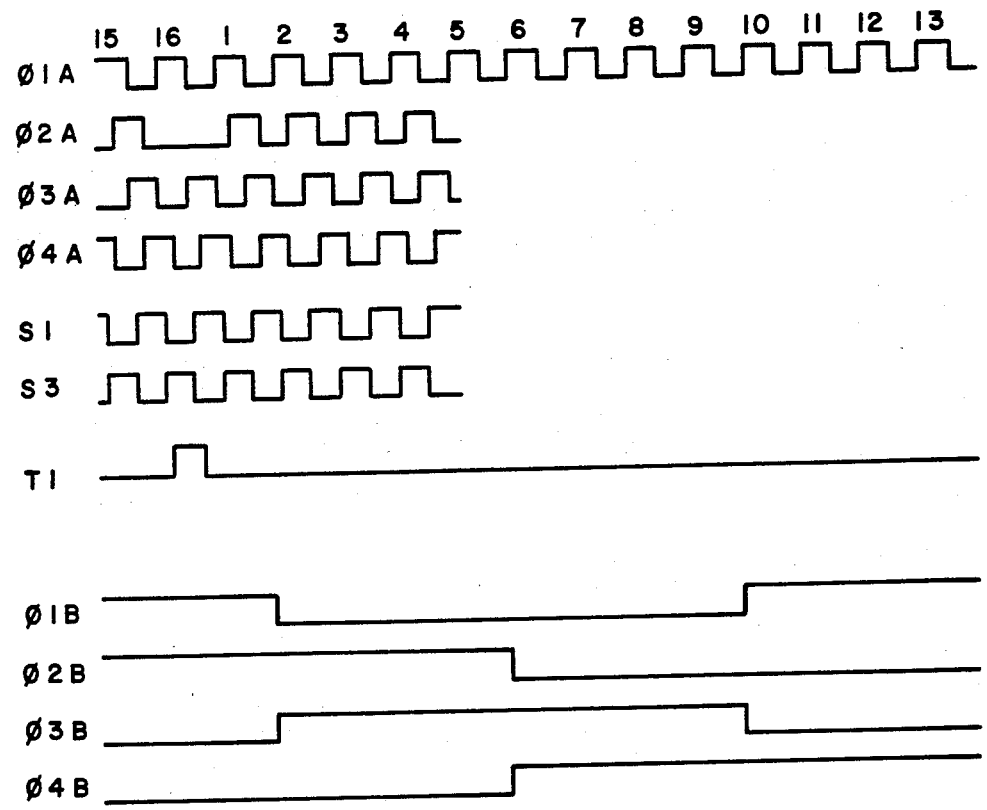

Referring to FIG. 3, a timing diagram of the fast-in mode of operation of the delay line circuit of FIG. 2 is illustrated. During the fast-in mode, the ∅1C–∅4C clocks and the reset clocks are held at a high level. The ∅1A–∅4A clock signals operate, in the presently described embodiment, at half the desired sampling rate up to approximately 250 megahertz in the well-known phase relationship as illustrated for transferring charge packets through a four-phase CCD.

Figure 4:
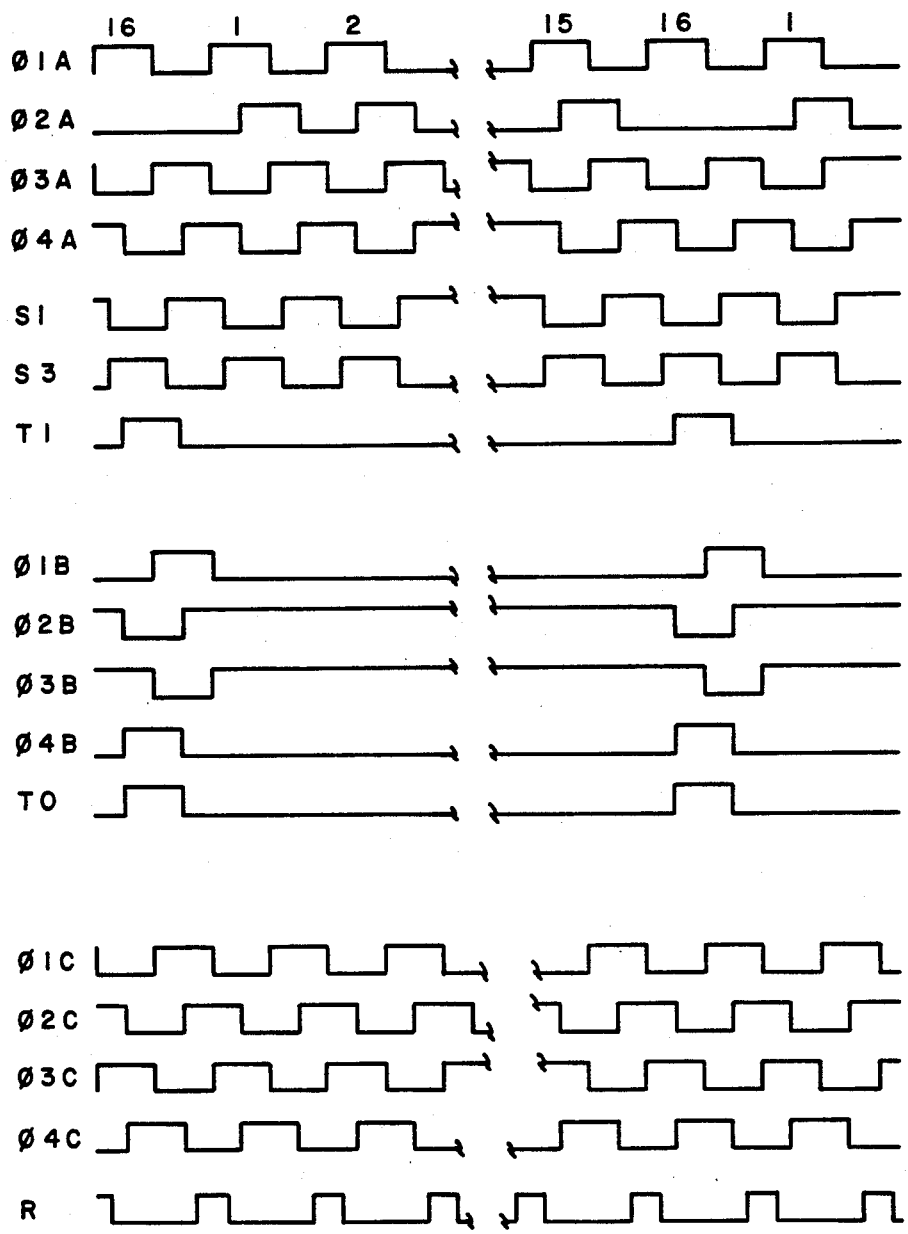

The input signal on the connection 15 is applied to both the input diodes 68, 70, and the input gate 72 is pulsed on by the sampling signal S1. Input-signal charge floods the area under the S1 electrode 72 and the adjacent ∅1 electrode 73 to a level determined by the input diode 68. The input gate 72 is then pulsed off and the signal charge is trapped under the ∅1 electrode 73. Similarly, when the input gate 74 of the serial register 62 is pulsed on by the sampling signal S3, input-signal charge floods the area under the S3 electrode 74 and the adjacent ∅3 electrode 78 to a level determined by the input diode 70. The input gate 74 is then pulsed off and the signal charge is trapped under the ∅3 electrode 78. By providing the sample clock S3 for the channel 2 CCD 32 which is 180 degrees out of phase with the sample clock S1 of the channel 1 CCD 31, two consecutive samples of the input signal are acquired during each transfer clock cycle, one by each channel. All signal samples are then clocked simultaneously through the arrays 31, 32 and appear at the outputs at the same time. Each sixteenth occurrence of the ∅2A signal is inhibited, and a T1 transfer signal is generated transferring data from the serial registers 62, 62', respectively, to the parallel registers 64, 64' and the ∅1B–∅4B signals, operating at one-sixteenth the rate of the ∅1A–∅4A clocks, transfer the charge packets through the parallel registers 64, 64'. After 33 cycles of the T1 signal, both delay lines are filled and the operation of the delay line is changed from the fast-in mode to the slow-out mode, for which reference is now made to the timing diagram of FIG. 4.

In the slow-out mode, the ∅1A–∅4A and the ∅1C–∅4C clocks operate at a frequency of 500 kilohertz while the ∅1B–∅4B clocks and the T0 clock operate at 31.25 kilohertz in the presently described embodiment of the invention. The output of each CCD delay line 31, 32 is detected simultaneously in a manner well known in the art, as by sensing the voltage variation of an output node 80, 80' at the source of an output amplifier 82, 82' operated in a source-follower configuration, a reset signal R being applied in common to the reset MOS transistor 84, 84' at the output circuit of each of the serial output registers 66, 66'.

Figure 2A:
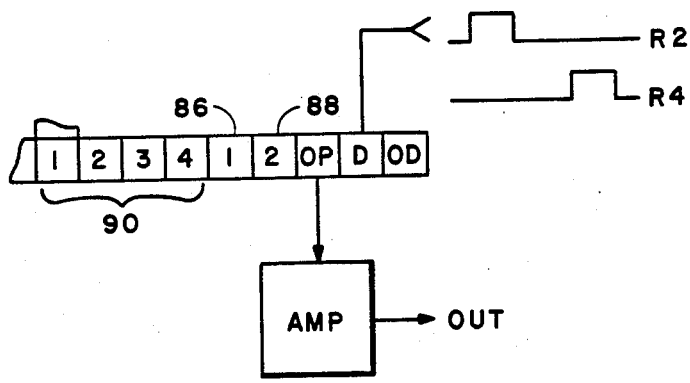

Referring now to FIG. 2A, there is shown an alternate configuration of output circuits of the serial output register 66, 66', wherein two additional transfer electrodes 86, 88 are added between the output gate 80' and a last charge-transfer cell 90 of the output register 66'. A reset clock R2 is applied to the reset MOS transistor 84', and an output clock R4 is applied to the corresponding reset MOST 84 of the other serial output register 66. External circuits such as the S/H circuits previously described with reference to FIG. 1 may thereby be eliminated.

In a delay line utilizing four-phase CCDs, an input signal may be demultiplexed into four CCD registers by adding additional transfer electrodes successively at the input thereof in the manner described with reference to FIG. 2 for a two-CCD structure, and by providing four successive phased sampling signals to the input sampling electrodes.

While the principles of the invention have now been made clear in the foregoing illustrative embodiment, there will be immediately obvious to those skilled in the art many modifications of structure, arrangement, proportions, the elements, materials and components used in the practice of the invention, and otherwise, which are particularly adapted for specific environments and operating requirements without departing from those principles. The appended claims are, therefore, intended to cover and embrace any such modifications, within the limits only of the true spirit and scope cf the invention.

What is claimed is:

1. A delay line, comprising:
    first and second charge-transfer devices, each having
        an input-signal control circuit including an input-signal element and a sampling element, each said input-signal element receiving a common input signal,
        an output circuit, and
        at least one charge-transfer cell intermediate the input-signal control circuit and the output circuit, each of the charge-transfer cells including N charge-transfer electrodes, where N is an integer and $1 < N <= 4$;
    a common N-phase clock signal source coupled to said charge-transfer devices and driving said charge-transfer cells simultaneously;
    said first charge-transfer device having a partial charge-transfer cell including at least one additional charge-transfer electrode intermediate the input-signal control circuit and said at least one charge-transfer cell; and
    a source of sampling clock signals having a period the same as the N-phase clock signals, said sampling clock signal source generating successive clock signals applied, respectively, to the sampling element of said charge-transfer devices, the sampling clock signals demultiplexing the input signal into said charge transfer devices, successively, during each period of said N-phase clock signal.

2. The delay line of claim 1, further comprising:
    a third charge-transfer device having
        an input-signal control circuit including an input signal element and a sampling element, said input-signal element of said third charge-transfer device receiving said common input signal,
        an output-circuit,
        at least one charge-transfer cell intermediate the input-signal control circuit of said third charge-transfer device and the output circuit of said third charge-transfer device, said at least one charge-transfer cell of said third charge-transfer device including N charge-transfer electrodes, where N is an integer, said common N-phase clock signal source being coupled to said third charge-transfer device and driving said charge-transfer cells of said third charge transfer device simultaneously with the charge-transfer cells of said first and second charge-transfer devices,
        a partial charge-transfer cell including one additional charge-transfer electrode intermediate the input-signal control circuit of said third charge-transfer device and said at least one charge-transfer cell of said third charge-transfer device;
    wherein $N = 3$, and
    said first charge-transfer device includes two said additional charge-transfer electrodes.

3. The delay line of claim 1, wherein each said charge-transfer device comprises a serial-parallel-serial charge coupled device.

4. The delay line of claim 1, wherein said clock signal sources operate at a first frequency for writing data into said delay line, and at a second frequency lower than said first frequency for reading data from said delay line.

5. The delay line of claim 1, wherein said second charge-transfer device includes a partial charge transfer cell comprising at least one additional charge-transfer electrode intermediate the output circuit and said at least one charge-transfer cell.

6. The delay line of claim 9, further comprising a second identical delay line on a common substrate therewith having differential input and output signals.

* * * * *